United States Patent
Yang et al.

(10) Patent No.: US 9,299,783 B2
(45) Date of Patent: Mar. 29, 2016

(54) TRANSISTOR AND METHOD OF OPERATING SAME

(71) Applicant: Samsung Electronics Co., Ltd., Suwon-Si, Gyeonggi-Do (KR)

(72) Inventors: Woo-young Yang, Hwaseong-si (KR); Ki-hong Kim, Osan-si (KR); Sang-jun Choi, Seoul (KR); Young-eal Kim, Hwaseong-si (KR); Seong-yong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/521,868

(22) Filed: Oct. 23, 2014

(65) Prior Publication Data

US 2015/0109048 A1  Apr. 23, 2015

(30) Foreign Application Priority Data

Oct. 23, 2013  (KR) .................. 10-2013-0126704

(51) Int. Cl.
*H01L 29/80* (2006.01)
*H01L 29/10* (2006.01)
*H01L 29/24* (2006.01)
(Continued)

(52) U.S. Cl.
CPC ............ *H01L 29/1029* (2013.01); *H01L 29/24* (2013.01); *H01L 29/45* (2013.01); *H01L 29/80* (2013.01); *H03K 17/687* (2013.01)

(58) Field of Classification Search
CPC ..... H01L 29/80; H01L 29/24; H01L 29/7869; H01L 29/1029; H01L 29/10
USPC ........................................................ 257/355
See application file for complete search history.

(56) References Cited

U.S. PATENT DOCUMENTS

| | | | |
|---|---|---|---|
| 4,442,445 A * | 4/1984 | Malik et al. .................. | 257/279 |
| 7,871,464 B2 | 1/2011 | Ono et al. | |
| 7,924,608 B2 | 4/2011 | Campbell | |

(Continued)

FOREIGN PATENT DOCUMENTS

| KR | 2006-0100145 A | 9/2006 |
|---|---|---|
| KR | 2008-0034310 A | 4/2008 |
| KR | 2008-0038045 A | 5/2008 |

OTHER PUBLICATIONS

Michael N. Kozicki, et al. "Resistance-change devices based on solid electrolytes", Proceedings of the European Symposium on Phase Change and Ovonic Science (E*PCOS), pp. 119-126 (2006).

(Continued)

*Primary Examiner* — Nathan Ha
(74) *Attorney, Agent, or Firm* — Harness, Dickey & Pierce, P.L.C.

(57) ABSTRACT

A transistor includes a channel forming layer on a substrate, a gate on the channel forming layer and including an electrochemically indifferent metal, a solid electrolyte layer between the channel forming layer and the gate, the solid electrolyte layer is formed as a stack structure with the gate on the channel forming layer, an active metal layer including an electrochemically active metal capable of enabling channel switching by using an oxidation-reduction reaction of the electrochemically active metal so that the active metal layer forms a metal channel in a channel region between the channel forming layer and the solid electrolyte layer, and a source and a drain electrically connected to the active metal layer.

20 Claims, 4 Drawing Sheets

(51) Int. Cl.
*H01L 29/45* (2006.01)
*H03K 17/687* (2006.01)

(56) References Cited

U.S. PATENT DOCUMENTS

| | | | | |
|---|---|---|---|---|
| 2009/0078964 A1* | 3/2009 | Briere | | 257/192 |
| 2010/0198521 A1* | 8/2010 | Haick | | 702/19 |
| 2013/0075788 A1* | 3/2013 | Tomabechi | | 257/194 |
| 2013/0341679 A1* | 12/2013 | Green et al. | | 257/192 |
| 2014/0061658 A1* | 3/2014 | Chiu et al. | | 257/76 |
| 2014/0077267 A1* | 3/2014 | Heo | | 257/194 |
| 2014/0138747 A1* | 5/2014 | Lee et al. | | 257/194 |
| 2014/0203826 A1* | 7/2014 | Evans et al. | | 324/693 |
| 2015/0069511 A1* | 3/2015 | Nygaard et al. | | 257/347 |

OTHER PUBLICATIONS

Michael Kund, et al. "Conductive bridging Ram (CBRAM): An emerging non-volatile memory technology scalable to sub 20nm", IEDM Technical Digest. IEEE International, pp. 754-757, (2005).

* cited by examiner

TRANSISTOR AND METHOD OF OPERATING SAME

CROSS REFERENCE TO RELATED APPLICATIONS

This application claims the benefit of Korean Patent Application No. 10-2013-0126704, filed on Oct. 23, 2013, in the Korean Intellectual Property Office, the disclosure of which is incorporated herein in its entirety by reference.

BACKGROUND

1. Field

Some example embodiments relate to methods and apparatuses for a transistor and/or a method of operating the same. Other example embodiments relate to a transistor having a solid electrolyte layer and/or a method of operating the same.

2. Description of the Related Art

A transistor, i.e., a field effect transistor (FET), is widely used as a switching device or a driving device in the field of electronic devices. For example, since one type of FET, i.e., a thin-film transistor (TFT), may be manufactured on a glass substrate or a plastic substrate, the TFT is used as a switching device or a driving device in a display field including a liquid crystal display, an organic light-emitting display, and the like. In addition, the TFT is used as a selection switch of a crosspoint memory device.

An amorphous silicon TFT (a-Si TFT) is used as a driving device and a switching device of a display. The a-Si TFT is most widely used at present as a TFT which may be uniformly formed on a large substrate with relatively low costs. However, along with the trend of a relatively large size and relatively high image quality of a display, there is also a demand for higher performance from a TFT, but the existing a-Si TFT has a limited charge mobility of about 0.5 cm$^2$/Vs. Since a poly-crystal silicon TFT (poly-Si TFT) has a relatively high mobility of tens to hundreds cm$^2$/Vs, the performance of a poly-Si TFT is more applicable to a relatively high image quality display when compared with the performance of the existing a-Si TFT. In addition, to implement a TFT having a relatively high mobility, a high-mobility TFT using a metal oxide semiconductor as a channel also has been developed.

These various types of transistors at present are based on a charge-based operation, and thus, problems, such as a short channel effect (SCE) and a gate voltage which cannot control a channel layer as desired, may occur when devices are miniaturized.

SUMMARY

Some example embodiments provide a transistor which switches a channel without an electron-based operation and is free from electron mobility and/or a method of operating the same.

Additional aspects will be set forth in part in the description which follows and, in part, will be apparent from the description, or may be learned by practice of the presented embodiments.

According to an example embodiment, a transistor includes a channel forming layer on a substrate, a gate on the channel forming layer and including an electrochemically indifferent metal, a solid electrolyte layer between the channel forming layer and the gate, the solid electrolyte layer is formed as a stack structure with the gate on the channel forming layer, an active metal layer including an electrochemically active metal and capable of enabling channel switching by using an oxidation-reduction reaction of the electrochemically active metal so that the active metal layer forms a metal channel in a channel region between the channel forming layer and the solid electrolyte layer, and a source and a drain electrically connected to the active metal layer.

The active metal layer may include a first portion corresponding to the channel region and be located in the channel region between the channel forming layer and the solid electrolyte layer during a gate on state, by diffusion of the active metal through the solid electrolyte layer according to a gate voltage applied to the gate and a second portion contacting the source and the drain. The active metal layer may be formed of an active metal including at least one of copper (Cu), silver (Ag), zinc (Zn), and nickel (Ni).

A thin thickness of the channel forming layer may inhibit the formation of a current path, and the channel forming layer may include a metal for seating the active metal present in the channel region when a first gate voltage is applied to the gate. The channel forming layer may have a thickness of about 1 nm or less. The metal of the channel forming layer is an inactive metal having a lower oxidizing power than the active metal of the active metal layer. The channel forming layer may include at least one of titanium (Ti) and W. The gate may be of an inactive metal including at least one selected from the group consisting of tungsten (W), platinum (Pt), gold (Au), and Ni.

The solid electrolyte layer may include one of a chalcogenide material, a chalcogenide material doped with an active metal, and an oxide having a solid electrolyte characteristic. The chalcogenide material may be at least one of germanium tellurium (GeTe), antimony tellurium (SbTe), germanium antimony tellurium (GeSbTe), germanium sulfide (GeS), and germanium selenium (GeSe). The active metal doped in the chalcogenide material may include at least one of Cu, Ag, Zn, and Ni. The oxide may be one of a tungsten oxide (WO$_3$) and a silicon oxide (SiO$_2$).

The channel forming layer may act as an adhesive between the upper surface of the substrate and the active metal layer. The substrate may be at least one of an inorganic substrate, an organic polymer substrate, a glass substrate, a flexible substrate having the electrical insulation property, and an undoped silicon substrate. The transistor may further include an insulating material layer on an upper surface of the substrate, and the insulating material layer may be one of a silicon oxide (SiO$_2$) and an aluminum oxide (Al$_2$O$_3$).

The active metal layer may include Cu, the solid electrolyte layer may include chalcogenide material, the gate may include W, and the channel forming layer may include Ti. At least one of the active metal layer, the gate, and the solid electrolyte layer may be formed by one of physical vapor deposition (PVD), chemical vapor deposition (CVD), and atomic layer deposition (ALD).

According to another example embodiment, a method of operating the transistor includes diffusing the active metal in a first portion of the active metal layer corresponding to a channel region through the solid electrolyte layer such that the first portion of the active metal layer is located between the channel forming layer and the solid electrolyte layer when a first gate voltage is applied to the gate and is located between the solid electrolyte layer and the gate when a second gate voltage is applied to the gate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
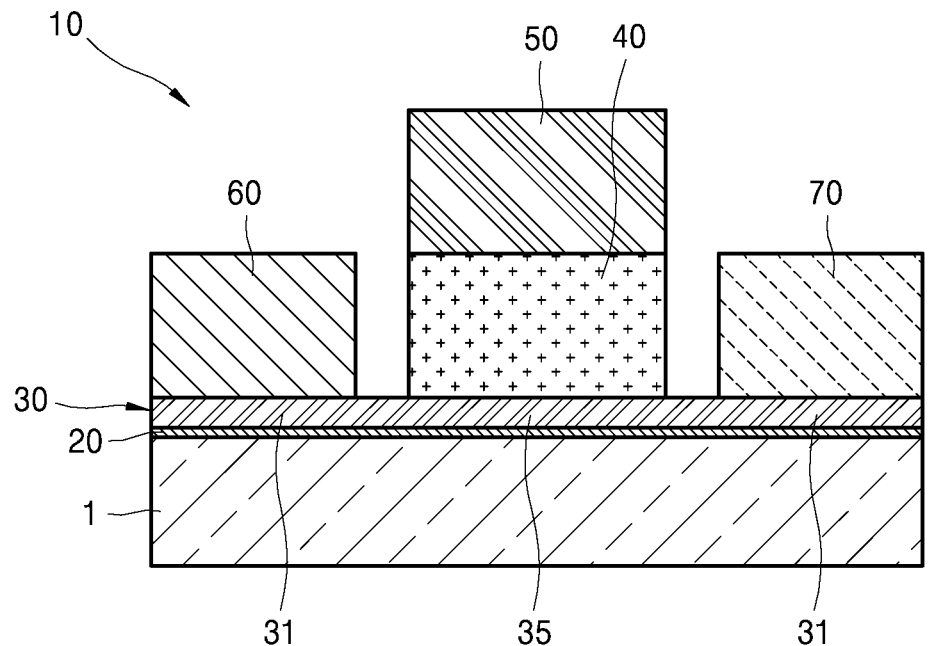
FIG. 1 is a schematic cross-sectional view of a transistor according to an example embodiment.

A transistor and a method of operating the same according to example embodiments will now be described in detail with reference to the accompanying drawings. In the drawings, like reference numerals refer to like elements throughout, and the sizes, the thicknesses, and the like of components in the drawings may be exaggerated for clarity and convenience of description. In addition, when it is described that a certain component is "above" or "on" another component, the certain component may be directly above another component, or a third component may be interposed therebetween. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a transistor 10 according to an example embodiment. The transistor 10 in FIG. 1 is an example of a normally-on transistor in which a first portion 35 of an active metal layer 30 corresponding to a channel region is formed to be located on a channel forming layer 20 in an initial stage.

Referring to FIG. 1, the transistor 10 may include a substrate 1, the channel forming layer 20 formed on the substrate 1, a gate 50 formed to include an electrochemically indifferent metal, a solid electrolyte layer 40 formed between the channel forming layer 20 and the gate 50 to have a stack structure with the gate 50, the active metal layer 30 formed to include an electrochemically active metal and enabling channel switching by using an oxidation-reduction reaction of the active metal, and a source 60 and a drain 70 electrically connected to the active metal layer 30. The active metal layer 30 includes the first portion 35 corresponding to the channel region and a second portion 31 formed on the channel forming layer 20 to contact the source 60 and the drain 70.

For the substrate 1, any type of material except for a metal is usable, and any type of material where the conductivity thereof is lower than that of an active metal is usable.

For example, the substrate 1 may be an insulating substrate. The insulating substrate may be a substrate formed of an insulating material or may be a substrate used for semiconductor manufacturing, having a structure in which an insulating material layer is on the upper surface of the substrate.

That is, for example, the substrate 1 may be any one of an inorganic substrate, an organic polymer substrate, a glass substrate, a flexible substrate having the electrical insulation property, and an undoped silicon substrate.

Alternatively, the substrate 1 may be a substrate having an insulating material layer, such as a silicon on insulator (SOI) substrate. When the substrate 1 has a structure in which an insulating material layer is on the upper surface thereof, the insulating material layer may be of an inorganic material, e.g., a silicon oxide ($SiO_2$) or an aluminum oxide ($Al_2O_3$), an organic polymer, or the like.

The channel forming layer 20 may be formed in the substrate 1. The channel forming layer 20 may be provided to maintain an off state in a gate-off state and to act as a metal for seating an active metal diffused in a gate-on state into the channel region.

To this end, the channel forming layer 20 may be formed to have a thickness that inhibits the formation of a current path (i.e., thin enough to not form a path through which a current flows). For example, the channel forming layer 20 may be formed with a thickness of about 1 nm or less. As such, if the channel forming layer 20 is formed with a thickness of about 1 nm or less, the channel forming layer 20 may not be actually formed in a thin-film shape. For example, the channel forming layer 20 may be an island shape. The channel forming layer 20 may be formed in a void shape in which a material forming the channel forming layer 20 only partially exists.

In this case, since a path through which a current flows is not formed in the channel forming layer 20, the channel forming layer 20 may be able to maintain an off state in a gate-off state and may act as a metal for seating the active metal diffused through the solid electrolyte layer 40 in a gate-on state into the channel region.

That is, to move the active metal when a gate-off state is changed to a gate-on state, a metal is supposed to be in the opposite side. If the channel forming layer 20 of a metallic material does not exist, the active metal diffused through the solid electrolyte layer 40 may move towards a metal located at a side portion of the channel region, e.g., towards the second portion 31 of the active metal layer 30. However, since the channel forming layer 20 exists, the active metal moves towards the channel forming layer 20 and is gathered in the channel region to thereby form a metal channel in the channel region.

The channel forming layer 20 may be formed to include an electrochemically indifferent metal, e.g., an electrochemically indifferent metal having a lower oxidizing power than that of the active metal forming the active metal layer 30. The channel forming layer 20 may use any type of metal only if the type of metal is an inactive metallic material which is not affected when the active metal forming the active metal layer 30 forms a metal channel by being reduced to the channel region. For example, the channel forming layer 20 may be formed of titanium (Ti), tungsten (W), or the like.

For example, when an insulating material layer of a $SiO_2$ layer is located on the upper surface of the substrate 1, and the active metal layer 30 is formed with a copper (Cu) layer, an adhesive force between $SiO_2$ and Cu may not be good. However, when the channel forming layer 20 is formed with a titanium (Ti) layer, the Ti layer may act as an adhesive between the $SiO_2$ layer and the Cu layer. As described above, by applying the channel forming layer 20, the active metal layer 30 may be formed on the substrate 1 by interposing the channel forming layer 20 therebetween.

As described above, the channel forming layer 20 may be formed of a material including an electromechanically indifferent metal, and may be formed to have a thickness that inhibits the formation of a current path (i.e., thin enough to not form a current path). The channel forming layer 20 formed as described above may be able to maintain an off state of the transistor 10 in a gate-off state and may function to form a metal channel by seating the active metal diffused in a gate-on state into the channel region. In addition, the channel forming layer 20 may act as an adhesive between the substrate 1 and the active metal layer 30.

The active metal layer 30 is formed to include an electromechanically active metal and is provided to enable channel switching by using an oxidization-reduction reaction of the active metal.

The active metal layer 30 may be formed to include at least one selected from the group consisting of Cu, silver (Ag), zinc (Zn), and nickel (Ni).

As described above, the active metal layer 30 may include the first portion 35 corresponding to the channel region and the second portion 31 except for the first portion 35. In this case, the first portion 35 may be a portion in which the active metal diffuses through the solid electrolyte layer 40 according to a gate voltage applied to the gate 50, and the second portion 31 may be a fixed portion on the channel forming layer 20.

That is, the active metal layer 30 may be provided so that the first portion 35 is located between the channel forming layer 20 and the solid electrolyte layer 40 to form a metal channel only in a gate-on state and at least the active metal of the first portion 35 corresponding to the channel region moves due to diffusion according to a voltage applied to the gate 50 not to form a metal channel in a gate-off state. As described above, the first portion 35 and the second portion 31 of the active metal layer 30 are formed on the channel forming layer 20, and a metal itself may be used as a channel switch according to an applied gate voltage.

As shown in FIG. 1, when the whole active metal layer 30, i.e., both the first portion 35 and the second portion 31, is located on the channel forming layer 20 in manufacturing, the transistor 10 may be a normally-on transistor in which a metal channel is formed in an initial stage.

That is, the whole active metal layer 30 may be formed to be located on the channel forming layer 20 in an initial manufacturing stage, and as known in the operation state diagrams of FIGS. 3A and 3B to be described below, the active metal layer 30 may operate so that the first portion 35 is located in the channel region to form a metal channel in a gate-on state and the active metal of the first portion 35 moves due to diffusion in a gate-off state not to form a channel, by using an electrochemical oxidization-reduction reaction of the active metal. FIG. 3B to be described below shows a case where the first portion 35 is gathered to form a layer between the solid electrolyte layer 40 and the gate 50 in a gate-off state. In a gate-off state, the active metal forming the first portion 35 (actually, active metal ions) may exist in a diffused state in the solid electrolyte layer 40.

The first portion 35 may indicate a portion of the active metal layer 30, which moves due to an electrochemical oxidization-reduction reaction, and the second portion 31 may indicate a portion of the active metal layer 30, which does not move due to an electrochemical oxidization-reduction reaction. In this case, sizes of the first portion 35 and the second portion 31 may vary according to repetition of a gate-on operation and a gate-off operation.

The solid electrolyte layer 40 is formed so as to include a solid electrolyte material. The solid electrolyte material has a relatively low electron conductance and a relatively high ion diffusion speed. The solid electrolyte layer 40 may be provided with an amorphous solid electrolyte layer 40.

The solid electrolyte layer 40 diffuses active metal ions of the active metal layer 30 according to an applied gate voltage and may be formed of a material including any one of a chalcogenide material, a chalcogenide material doped with an active metal, and an oxide having a solid electrolyte characteristic.

The chalcogenide material may be at least one selected from the group consisting of germanium tellurium (GeTe), antimony tellurium (SbTe), germanium antimony tellurium (GeSbTe), germanium sulfide (GeS), and germanium selenium (GeSe). The active metal doped in the chalcogenide material may be the same metal as the active metal forming the active metal layer 30. That is, the active metal doped in the chalcogenide material may be at least one selected from the group consisting of Cu, Ag, Zn, and Ni. The oxide may be any one of tungsten oxide ($WO_3$) and $SiO_2$.

The solid electrolyte layer 40 may be deposited at a relatively low temperature or doped with nitrogen ($N_2$) in a deposition process to be manufactured in an amorphous state. The doping of $N_2$ helps amorphousness of the solid electrolyte layer 40. The solid electrolyte layer 40 may be deposited by using atomic layer deposition (ALD), physical vapor deposition (PVD), or chemical vapor deposition (CVD), wherein PVD may include sputtering and e-beam evaporation.

The gate 50 is to perform channel switching by applying a gate voltage thereto and may be formed of an electrochemically indifferent metal on the solid electrolyte layer 40. For example, the gate 50 may be formed to include any one inactive metal of W, platinum (Pt), gold (Au), and Ni.

The active metal layer 30, the solid electrolyte layer 40, and the gate 50 may be deposited by a relatively low-temperature process, such as ALD, CVD, or the like, or by a normal-temperature process, such as PVD or the like, wherein PVD may include sputtering and e-beam evaporation. As described above, since epitaxial growth requiring a relatively high-temperature process is not used in a deposition process of the active metal layer 30, the solid electrolyte layer 40, and the gate 50, the transistor 10 according to an example embodiment may be manufactured with relatively low costs.

The source 60 and the drain 70 may be formed to be apart from a stack structure of the first portion 35 of the active metal layer 30, the solid electrolyte layer 40, and the gate 50 and to be electrically connected to the active metal layer 30 in a gate-on state. As shown in FIG. 1, in a structure where the active metal layer 30 includes the second portion 31 in addition to the first portion 35 corresponding to the channel region, the source 60 and the drain 70 may be formed to contact the second portion 31 of the active metal layer 30.

In the normally-on transistor 10 as shown in FIG. 1, a location of the first portion 35 may vary in a gate-on operation and a gate-off operation as described below with reference to FIGS. 3A and 3B.

Figure 2:
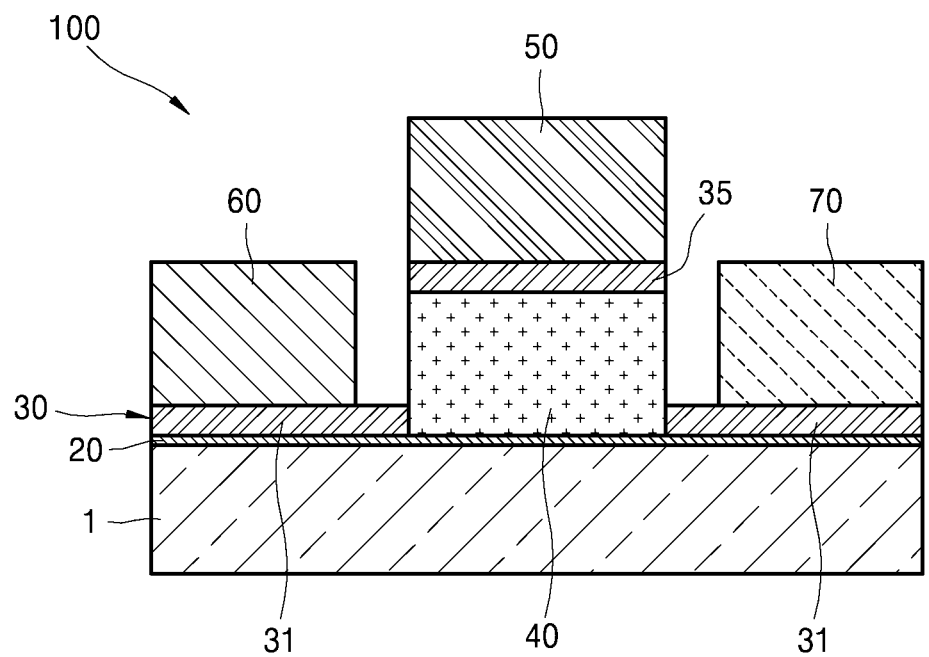
FIG. 2 is a schematic cross-sectional view of a transistor according to another example embodiment.

FIG. 2 is a schematic cross-sectional view of a transistor 100 according to another example embodiment. The transistor 100 in FIG. 2 is an example of a normally-off transistor in which the first portion 35 of an active metal layer 30 corresponding to the channel region is formed to be located between the solid electrolyte layer 40 and the gate 50 in an initial manufacturing stage. Compared with FIG. 1, the transistor 100 in FIG. 2 may have substantially the same configuration as the transistor 10 in FIG. 1 except for a location difference of the first portion 35. Thus, like reference numerals refer to like elements, and their repetitive description is omitted.

Referring to FIG. 2, the transistor 100 may include the substrate 1, the channel forming layer 20 formed on the substrate 1, the gate 50 formed to include an electrochemically indifferent metal, the solid electrolyte layer 40 formed between the channel forming layer 20 and the gate 50 to have a stack structure with the gate 50, the active metal layer 30 formed to include an electrochemically active metal and enabling channel switching by using an oxidation-reduction reaction of the active metal, and the source 60 and the drain 70 electrically connected to the active metal layer 30. The active metal layer 30 includes the first portion 35 corresponding to the channel region and the second portion 31 formed on the channel forming layer 20 to contact the source 60 and the drain 70.

The active metal layer 30 may include the first portion 35 corresponding to the channel region and the second portion 31 except for the first portion 35. In this case, the first portion 35 is a portion in which the active metal diffuses through the solid electrolyte layer 40 according to a gate voltage applied to the gate 50, and the second portion 31 is a fixed portion on the channel forming layer 20.

The first portion 35 may indicate a portion of the active metal layer 30, which moves due to an electrochemical oxidization-reduction reaction, and the second portion 31 may indicate a portion of the active metal layer 30, which does not move due to an electrochemical oxidization-reduction reaction. In this case, sizes of the first portion 35 and the second portion 31 may vary according to repetition of a gate-on operation and a gate-off operation.

As shown in FIG. 2, when the active metal layer 30 is formed in manufacturing thereof so that the first portion 35 is located between the solid electrolyte layer 40 and the gate 50 and only the second portion 31 is located on the channel forming layer 20, the transistor 100 does not have a metal channel in an initial stage, and thus, the transistor 100 may be a normally-off transistor.

Even in the transistor 100 according to the present embodiment, the first portion 35 of the active metal layer 30 is located between the channel forming layer 20 and the solid electrolyte layer 40 to form a metal channel in a gate-on state, and the active metal of the first portion 35 moves due to diffusion according to a voltage applied to the gate not to form a metal channel in a gate-off state. Thus, like the normally-on transistor 10 described with reference to FIG. 1, in the transistor 100 according to the present embodiment, a metal itself may also be used as a channel switch according to an applied gate voltage.

That is, by using an electrochemical oxidization-reduction reaction of the active metal, the transistor 100 may operate so that the active metal of the first portion 35 moves due to diffusion to form a metal channel in a gate-on state and the first portion 35 is located between the solid electrolyte layer 40 and the gate 50 not to form a channel in a gate-off state. FIG. 2 shows a case where the first portion 35 is formed to make a layer between the solid electrolyte layer 40 and the gate 50 in an initial manufacturing stage. A gate-on operation and a gate-off operation repeat in the transistor 100, wherein in the gate-off operation, the first portion 35 may be gathered to form a layer between the solid electrolyte layer 40 and the gate 50, or the active metal forming the first portion 35 (actually, active metal ions) may exist in the solid electrolyte layer 40 in a diffused state.

In the normally-off transistor 100 shown in FIG. 2, a location of the first portion 35 may vary in a gate-on operation and a gate-off operation as described below with reference to FIGS. 3A and 3B.

Figure 3A:
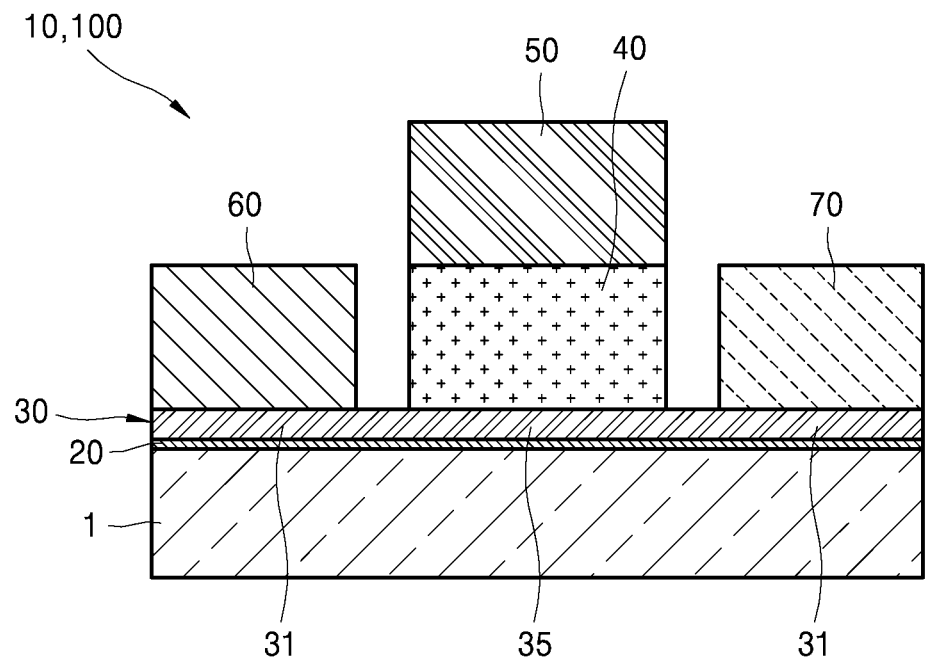
FIGS. 3A and 3B are schematic cross-sectional views for describing an operation principle of the transistors according to example embodiments.
Figure 3B:
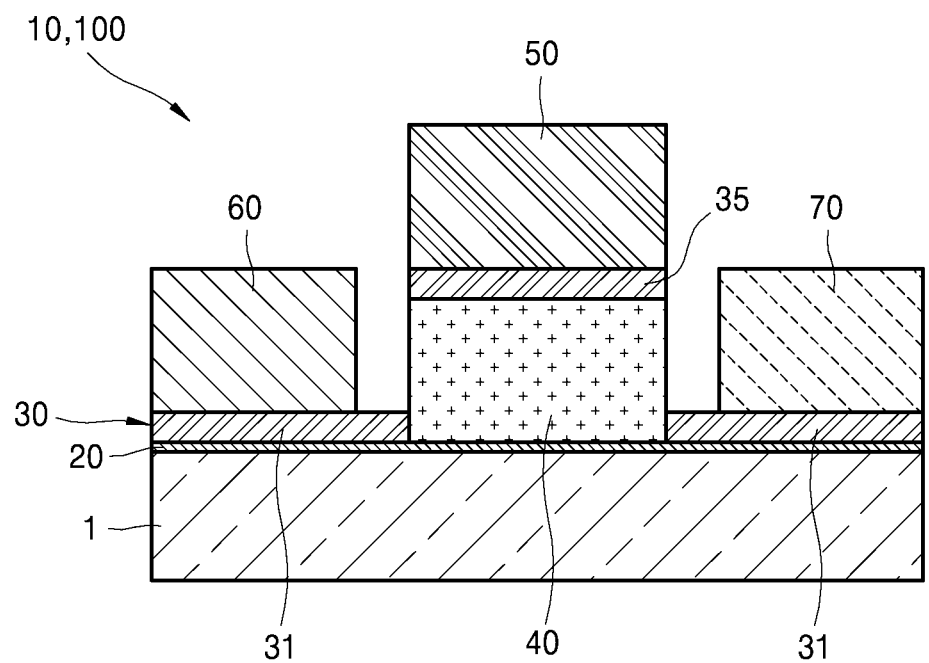

FIGS. 3A and 3B are schematic cross-sectional views for describing an operation principle of the transistors 10 and 100 according to example embodiments, which have been described with reference to FIGS. 1 and 2. FIG. 3A shows a gate-on state where a metal channel is formed in the transistor 10 or 100 according to example embodiments. FIG. 3B shows a gate-off state where a metal channel does not exist in the transistor 10 or 100 according to example embodiments.

A state where a metal channel is formed in the transistor 10 or 100 with the first portion 35 of the active metal layer 30 which is located in the channel region as shown in FIG. 3A is considered. When a second (i.e., negative) gate voltage is applied to the gate 50 of the transistor 10 or 100 in this state, the active metal in the first portion 35 of the active metal layer 30 located on the channel forming layer 20 is oxidized and diffuses and moves through the solid electrolyte layer 40 in an ion state and forms a layer by being reduced on an interface between the solid electrolyte layer 40 and the gate 50. Accordingly, the first portion 35 of the active metal layer 30 on the channel forming layer 20 may move to a location between the solid electrolyte layer 40 and the gate 50. In this case, since a channel is not formed in the transistor 10 or 100, the transistor 10 or 100 is in a gate-off state. At this time, at least a portion of the active metal in the gate-off state may exist as a diffused state in the solid electrolyte layer 40.

As shown in FIG. 3B, when a first (i.e., positive) gate voltage is applied to the gate 50 of the transistor 10 or 100 in a state where the first portion 35 of the active metal layer 30 is located between the solid electrolyte layer 40 and the gate 50, the active metal in the first portion 35 of the active metal layer 30 between the solid electrolyte layer 40 and the gate 50 is oxidized and diffuses and moves through the solid electrolyte layer 40 in an ion state and forms a metal channel in the channel region by being reduced on an interface between the solid electrolyte layer 40 and the channel forming layer 20.

At this time, due to the existence of the channel forming layer 20, the active metal ions diffused in a gate-on state may be reduced and seated in the channel region to form a metal channel.

For example, a case where the active metal layer 30 is of Cu, the solid electrolyte layer 40 is of GeTe, and the gate 50 is of W is considered.

In this case, when a second (i.e., negative) gate voltage is applied to the gate 50, Cu below GeTe is oxidized and changed to copper ions ($Cu^{2+}$) and diffuses towards the gate 50 formed of W through the solid electrolyte layer 40 formed of GeTe. When the diffused copper ions ($Cu^{2+}$) meets W, the copper ions ($Cu^{2+}$) are reduced to metallic copper again. Accordingly, a layer formed of Cu, i.e., the first portion 35 of the active metal layer 30, is formed on the interface between the solid electrolyte layer 40 and the gate 50, and no channel is formed in the transistor 10 or 100, and thus, the transistor 10 or 100 is in a gate-off state.

When a first (i.e., positive) gate voltage is applied to the gate 50, Cu below W is oxidized to copper ions ($Cu^{2+}$) and diffuses towards the channel forming layer 20 through the solid electrolyte layer 40. When the diffused copper ions ($Cu^{2+}$) meet a metallic material, e.g., Ti, forming the channel forming layer 20, the copper ions ($Cu^{2+}$) are reduced to metallic copper again. Accordingly, a layer formed of Cu, i.e., the first portion 35 of the active metal layer 30, is formed on the interface between the channel forming layer 20 and the solid electrolyte layer 40, and a metal channel is formed in the transistor 10 or 100, and thus, the transistor 10 or 100 is in a gate-on state.

According to a voltage applied to the gate 50, a location of the first portion 35 moves to thereby enable channel switching, such that the first portion 35 of the active metal layer 30 is located in the channel region between the channel forming layer 20 and the solid electrolyte layer 40 in a gate-on operation and located between the solid electrolyte layer 40 and the gate 50 in a gate-off operation.

Figure 4:
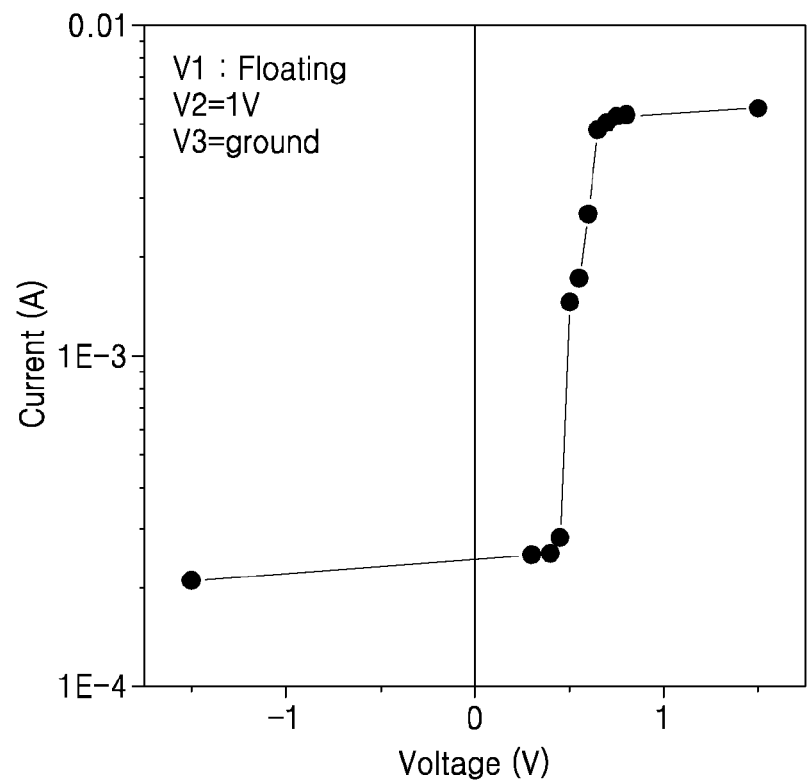
FIG. 4 is a graph showing an on-off characteristic of a transistor to which a gate voltage is applied, according to an example embodiment.

FIG. 4 is a graph showing an on-off characteristic of a transistor to which a gate voltage is applied, according to an example embodiment, which has been described with reference to FIGS. 1 to 3B.

In FIG. 4, V1 denotes the gate 50, wherein the gate 50 is in a floating state, and a voltage applied thereto is variable. V2 denotes a voltage applied to the source 60, wherein a fixed voltage, e.g., about 1 V, is applied thereto. V3 denotes the drain 70, wherein the drain 70 is grounded.

As shown in the graph of FIG. 4, when a first (i.e., positive) gate voltage is applied to the gate 50, current flows through the transistor, and the transistor is in a gate-on state. When a second (i.e., negative) gate voltage is applied to the gate 50, no current flows through the transistor, and the transistor is in a gate-off state.

Figure 5:
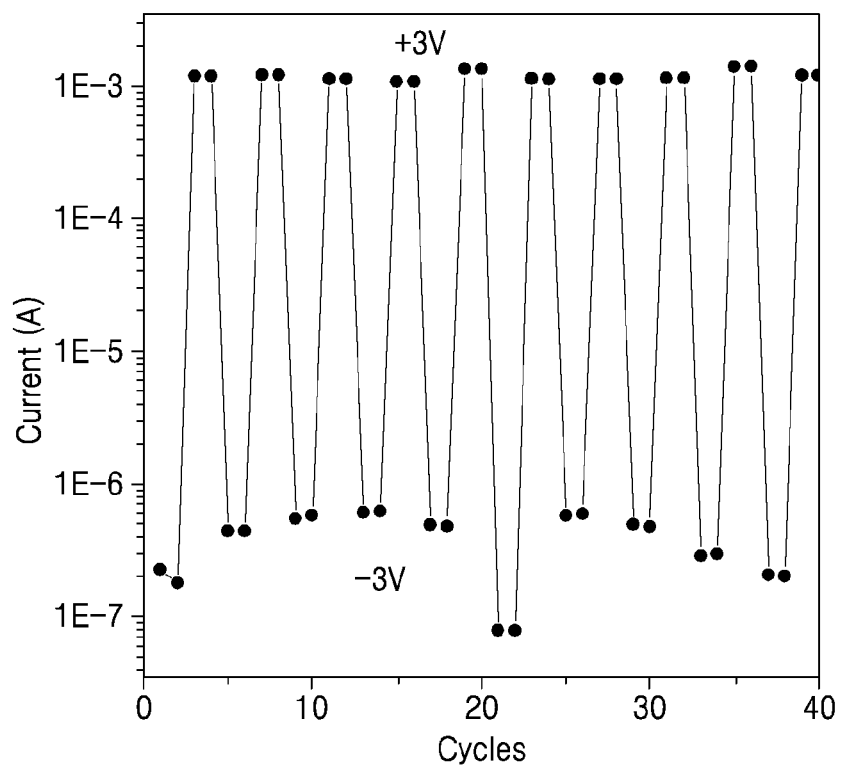
FIG. 5 is a graph showing a gate on-off repetition characteristic of a transistor according to an example embodiment.

FIG. 5 is a graph showing a gate on-off repetition characteristic of a transistor according to an example embodiment, which has been described with reference to FIGS. 1 to 3B.

As shown in FIG. 5, according to the transistor according to an example embodiment, even though a gate on-off operation of the gate 50 is repeated more than tens of times, gate-on operations and gate-off operations may be well performed.

FIGS. 4 and 5 show that the transistor according to an example embodiment normally operates.

Figure 6:
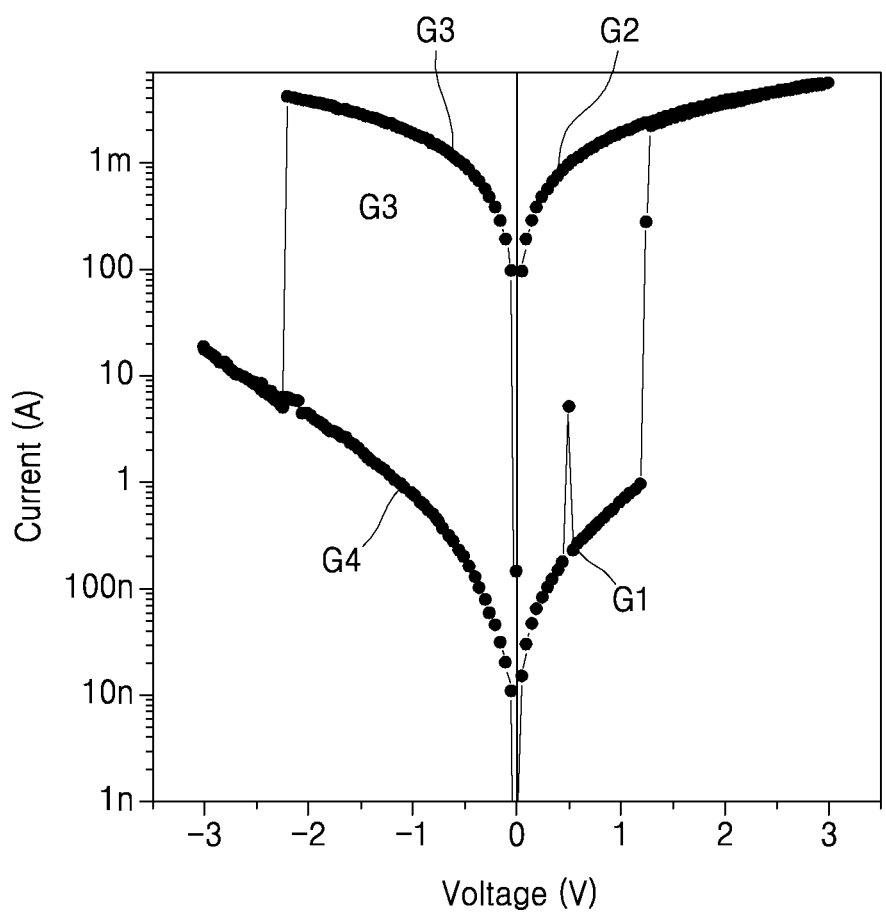
FIG. 6 is a graph showing a nonvolatile switching memory characteristic according to an example embodiment.

FIG. 6 shows a switching memory characteristic which may be obtained from the structure of FIG. 1. The results of FIGS. 4 and 5 show transistor characteristics of a three-terminal device using the structure of FIG. 1, whereas FIG. 6 shows a nonvolatile switching memory characteristic of a two-terminal device using only source and gate electrodes.

According to a current-voltage characteristic of a transistor according to an example embodiment, which is shown in FIG. 6, a switching characteristic is shown in both a positive voltage region and a second voltage region. That is, the transistor according to an example embodiment has not only a transistor characteristic but also a memory characteristic.

When the transistor according to an example embodiment operates as a memory, the transistor is in a gate-on state. That is, the transistor may operate as a memory in a state where the first portion 35 of the active metal layer 30 is located in the channel region to form a metal channel.

In FIG. 6, a first graph G1 shows a case where a resistance of the solid electrolyte layer 40 is relatively high, and a current is relatively low. When a first (i.e., positive voltage) to the active metal layer 30 increases along the first graph G1, active metal ions, e.g., copper ions, move from the active metal layer 30 to the solid electrolyte layer 40 at a predefined threshold voltage, i.e., a set voltage Vset, or above to thereby generate a current path in the solid electrolyte layer 40. At this time, a resistance of the solid electrolyte layer 40 decreases, and a current flowing through is relatively high, and the current-voltage characteristic of the transistor according to an example embodiment follows a second graph G2 (a relatively low-resistance state).

When a given (or alternatively, predefined) threshold voltage, e.g., a voltage less than a reset voltage Vreset (based on an absolute value), is applied to the active metal layer 30, the resistance of the solid electrolyte layer 40 is maintained in the decreased state, and the current-voltage characteristic follows a third graph G3. Thereafter, when the reset voltage Vreset is applied to the active metal layer 30, the active metal ions, e.g., copper ions, move from the solid electrolyte layer 40 to the active metal layer 30, and the solid electrolyte layer 40 returns to a relatively high-resistance state. Thus, the current-voltage characteristic follows a fourth graph G4. Herein, G2 and G3 indicate the lower-resistance state, and G1 and G4 indicate the higher-resistance state.

According to the result of FIG. 6 in addition to the results of FIGS. 4 and 5, the transistor according to an example embodiment may not only have a transistor characteristic but also operate as a memory. That is, the transistor according to an example embodiment may have both a memory characteristic and a transistor characteristic in one device structure.

As described above, according to example embodiments, since a transistor uses a metal channel, the transistor is free from electron mobility, and a channel may be switched without an electron-based operation.

In addition, since an epitaxial process is not used, a transistor may be manufactured with relatively low costs.

In addition, since one transistor may have both a transistor characteristic and a memory characteristic, when the transistor is applied to a memory device, a degree of integration may be higher.

It should be understood that the example embodiments described therein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope of the following claims.

What is claimed is:

1. A transistor comprising:
   a channel forming layer on a substrate;
   a gate on the channel forming layer, the gate including an electrochemically indifferent metal;
   a solid electrolyte layer between the channel forming layer and the gate, the solid electrolyte layer is formed as a stack structure with the gate on the channel forming layer;
   an active metal layer including an electrochemically active metal and capable of enabling channel switching by using an oxidation-reduction reaction of the electrochemically active metal so that the active metal layer forms a metal channel in a channel region between the channel forming layer and the solid electrolyte layer; and
   a source and a drain electrically connected to the active metal layer.

2. The transistor of claim 1, wherein the active metal layer includes,
   a first portion corresponding to the channel region, the first portion is located in the channel region between the channel forming layer and the solid electrolyte layer during a gate on state, by diffusion of the active metal through the solid electrolyte layer according to a gate voltage applied to the gate, and
   a second portion contacting the source and the drain.

3. The transistor of claim 2, wherein the active metal layer is formed of an active metal including at least one of copper (Cu), silver (Ag), zinc (Zn), and nickel (Ni).

4. The transistor of claim 1, wherein
   a thickness of the channel forming layer inhibits the formation of a current path, and
   the channel forming layer includes a metal for seating the active metal present in the channel region when a first gate voltage is applied to the gate.

5. The transistor of claim 4, wherein the channel forming layer has a thickness of about 1 nm or less.

6. The transistor of claim 4, wherein the metal of the channel forming layer is an inactive metal having a lower oxidizing power than the active metal of the active metal layer.

7. The transistor of claim 6, wherein the channel forming layer comprises at least one of titanium (Ti) and W.

8. The transistor of claim 1, wherein the active metal layer is formed of an active metal including at least one of Cu, Ag, Zn, and Ni.

9. The transistor of claim 1, wherein the gate is formed of an inactive metal including at least one of tungsten (W), platinum (Pt), gold (Au), and Ni.

10. The transistor of claim 1, wherein the solid electrolyte layer comprises one of a chalcogenide material, a chalcogenide material doped with an active metal, and an oxide having a solid electrolyte characteristic.

11. The transistor of claim 10, wherein the chalcogenide material is at least one of germanium tellurium (GeTe), antimony tellurium (SbTe), germanium antimony tellurium (GeSbTe), germanium sulfide (GeS), and germanium selenium (GeSe).

12. The transistor of claim 10, wherein the active metal doped in the chalcogenide material includes at least one of Cu, Ag, Zn, and Ni.

13. The transistor of claim 10, wherein the oxide is one of a tungsten oxide ($WO_3$) and a silicon oxide ($SiO_2$).

14. The transistor of claim 1, wherein the channel forming layer acts as an adhesive between the upper surface of the substrate and the active metal layer.

15. The transistor of claim 14, wherein the channel forming layer comprises at least one of Ti and W.

16. The transistor of claim 1, wherein the substrate is at least one of an inorganic substrate, an organic polymer substrate, a glass substrate, a flexible substrate having an electrical insulation property, and an undoped silicon substrate.

17. The transistor of claim 1, further comprising:
    an insulating material layer on an upper surface of the substrate, the insulating material layer including one of a silicon oxide ($SiO_2$) and an aluminum oxide ($Al_2O_3$).

18. The transistor of claim 1, wherein the active metal layer comprises Cu, the solid electrolyte layer comprises chalcogenide material, the gate comprises W, and the channel forming layer comprises Ti.

19. The transistor of claim 1, wherein at least one of the active metal layer, the gate, and the solid electrolyte layer is formed by one of physical vapor deposition (PVD), chemical vapor deposition (CVD), and atomic layer deposition (ALD).

20. A method of operating the transistor of claim 1, the method comprising:
    diffusing the active metal in a first portion of the active metal layer corresponding to a channel region through the solid electrolyte layer such that the first portion of the active metal layer is located between the channel forming layer and the solid electrolyte layer when a first gate voltage is applied to the gate and is located between the solid electrolyte layer and the gate when a second gate voltage is applied to the gate.

* * * * *